(12) United States Patent
Scott et al.

(10) Patent No.: US 7,648,389 B1
(45) Date of Patent: Jan. 19, 2010

(54) SUPPLY SIDE BACKFEED METER SOCKET ADAPTER

(75) Inventors: Damien Scott, Daly City, CA (US); Dennis Alan Cox, Clovis, CA (US); Ben Tarbell, Palo Alto, CA (US)

(73) Assignee: Solarcity Corporation, Foster City, CA (US)

( * ) Notice: Subject to any disclaimer, the term of this patent is extended or adjusted under 35 U.S.C. 154(b) by 0 days.

(21) Appl. No.: 12/166,205

(22) Filed: Jul. 1, 2008

(51) Int. Cl.
*H01R 33/945* (2006.01)
(52) U.S. Cl. ..................................... 439/517
(58) Field of Classification Search ............... 439/517, 439/146, 167, 508
See application file for complete search history.

(56) References Cited

U.S. PATENT DOCUMENTS

| | | | |
|---|---|---|---|
| 5,588,874 A * | 12/1996 | Pruehs et al. ............... | 439/517 |
| 6,059,605 A * | 5/2000 | Robinson et al. ............ | 439/517 |
| 6,188,145 B1 * | 2/2001 | Stewart ....................... | 307/125 |
| 6,846,199 B1 * | 1/2005 | Robinson et al. ............ | 439/517 |
| 2005/0207097 A1 * | 9/2005 | Neace ......................... | 361/627 |

* cited by examiner

*Primary Examiner*—T C Patel
*Assistant Examiner*—Harshad C Patel
(74) *Attorney, Agent, or Firm*—Fountainhead Law Group P.C.

(57) ABSTRACT

A utility meter adapter plugs between a utility meter and its meter socket to provide a power pigtail suitable for a solar electric system to backfeed power to the utility. A round plastic base has several connector jaw blades underneath positioned like a meter to fit in a meter socket and its jaw sockets. A corresponding set of jaw sockets is provided for the jaw blades on the meter to plug into the topside. The jaw sockets in the adapter on the load side of the meter are pigtailed to terminal lugs with a conduit access. A solar electric system backfeed can be run through conduit tubing to the terminal lugs on top of any flush walls, thus avoiding any disturbances to the pre-existing walls and service panels.

12 Claims, 6 Drawing Sheets

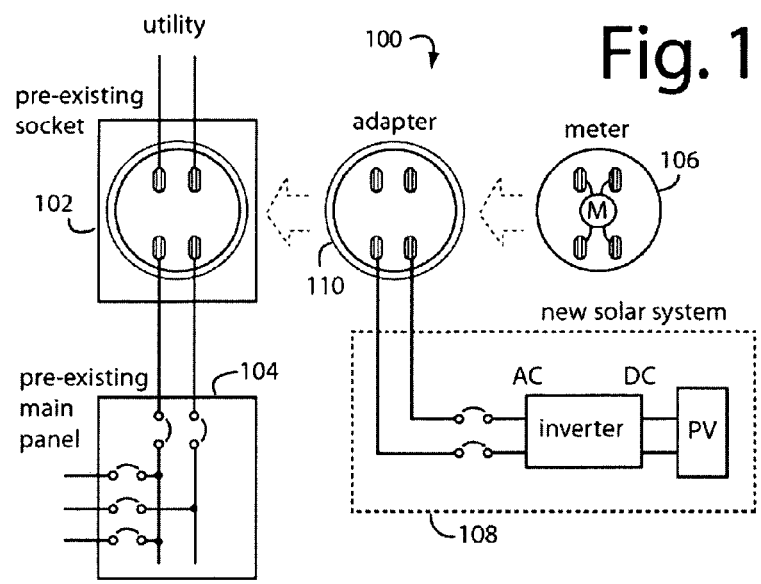
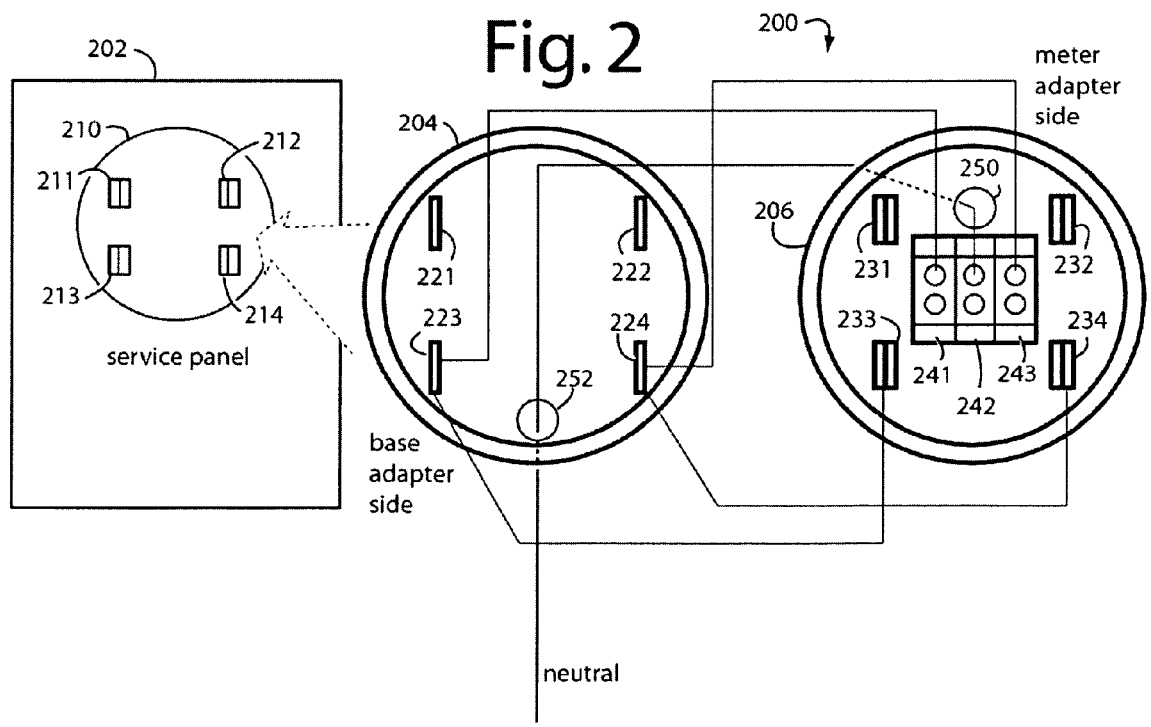

US 7,648,389 B1

SUPPLY SIDE BACKFEED METER SOCKET ADAPTER

FIELD OF THE INVENTION

The present invention relates to electrical components, and more particularly to devices for connecting energy generating systems including solar energy systems, wind, fuel cells and other renewable energy generation methods, in addition to hydrocarbon fuel based generators and battery back-up systems to electric utilities to back feed excess power without having to disturb or modify an existing electrical distribution panel.

DESCRIPTION OF THE PRIOR ART

As recently as thirty years ago, a typical American home was supplied with a 60-amp electrical service. Today, small homes have 150-amp or larger service panels, and larger homes can have a 200-amp or larger service. Certain homes with many electrical appliances like electric water heaters, electric stoves and ovens, and central air conditioning can be equipped with 400-amp service panels.

The usual electrical service coming in from the utility is 240-volts AC supplied as two 120-volt circuits 180-degrees out of phase and on three wires, two hot and one neutral. These three wires carry first through a utility meter familiar to most Americans as a round glass enveloped instrument with a spinning disk inside that shows the rate at which the home is consuming power. The face of the meter has several dials or other read-outs that register the total power consumption in kilo-watt hours (kWh). After the meter, a main disconnect tandem circuit breaker connects to a distribution panel with many branch circuit breakers. Sometimes there are spare, unused locations in the distribution panel where new branch circuits can be added.

But more often than not, there is no room in the distribution panel for more circuits. Or the backfeed from the generator is larger than code would allow for the given distribution panel size. Certainly not the big circuits needed to support a utility back feed from a substantial solar electric installation. And any but the most modest of additions to the panel could trigger a whole host of problems with service capacity, code inspections, and major rewiring. Also eliminates the danger of disturbing older panels which could create an unsafe condition.

What is needed is a device for connecting a solar energy system to a utility power panel between the main disconnect and the meter, and without causing or needing any modifications at all to the pre-existing main power disconnects or power distribution panels.

SUMMARY OF THE INVENTION

Briefly, a utility meter adapter embodiment of the present invention plugs between a utility meter and its meter socket to provide a power pigtail suitable for a solar electric system to backfeed power to the utility. A round plastic or metal base has several connector jaw blades underneath positioned like a meter to fit in a meter socket and its jaw sockets. A corresponding set of jaw sockets is provided for the jaw blades on the meter to plug into the topside. The jaw sockets in the adapter on the load side of the meter are pigtailed to terminal lugs with a conduit access. A solar electric system backfeed can be run through conduit tubing to the terminal lugs on top of any flush walls, thus avoiding any disturbances to the pre-existing walls and service panels.

These and other objects and advantages of the present invention will no doubt become obvious to those of ordinary skill in the art after having read the following detailed description of the preferred embodiments which are illustrated in the drawing figure.

IN THE DRAWINGS

FIG. 1 is a schematic diagram of a pre-existing utility socket, meter, and main panel, and how an adapter embodiment of the present invention would allow the connection of a new solar system to backfeed to a utility. The AC neutral wiring is not shown to keep the illustration uncluttered;

FIG. 2 is a schematic diagram of an adapter embodiment of the present invention and details the arrangement of jaw blades in the adapter that plug into the service panel and the jaw sockets that accept a utility meter on top. A terminal lug strip provides a way to pigtail power through conduits to a solar electric system;

Figure 4:
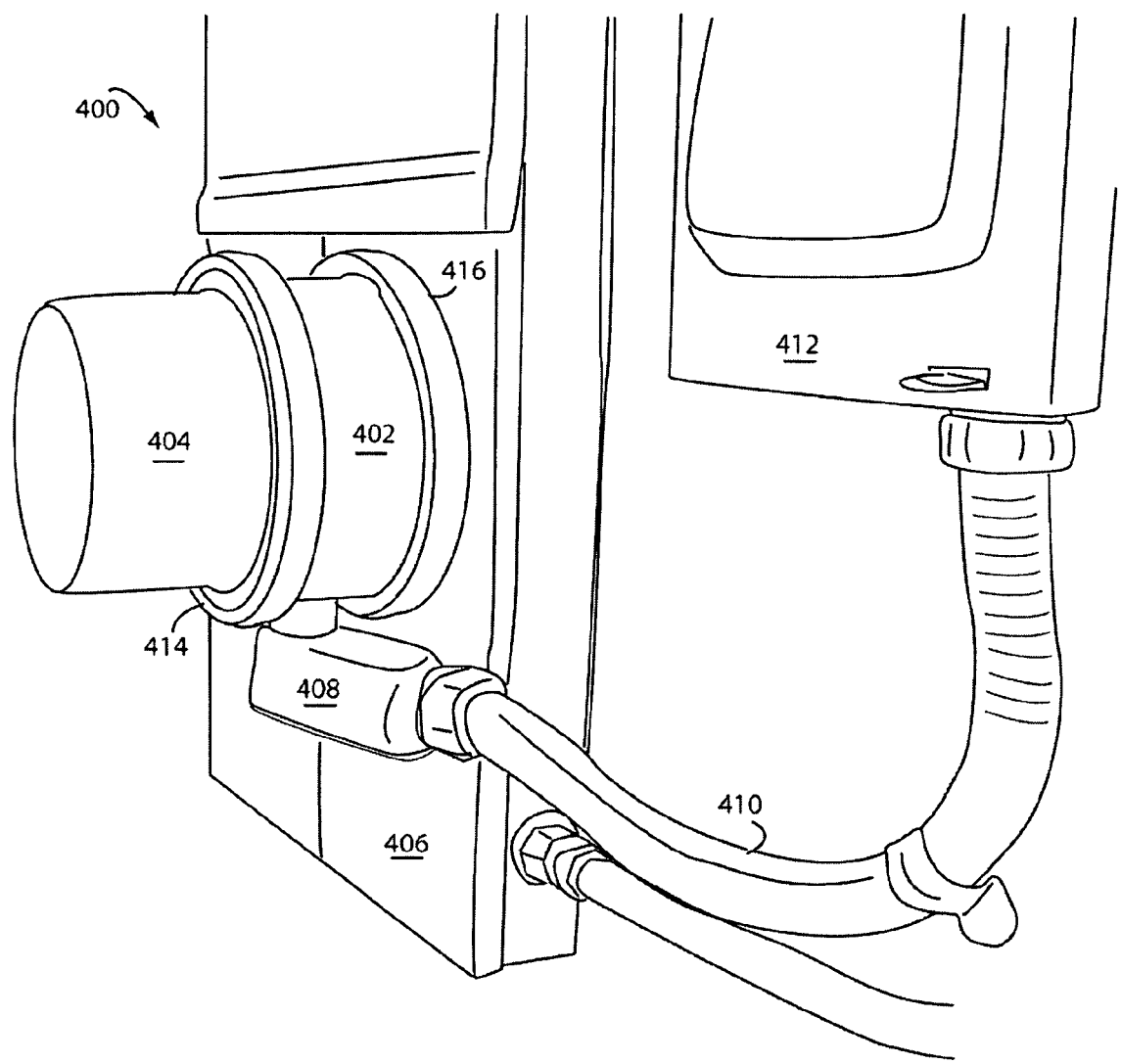
Figure 5:
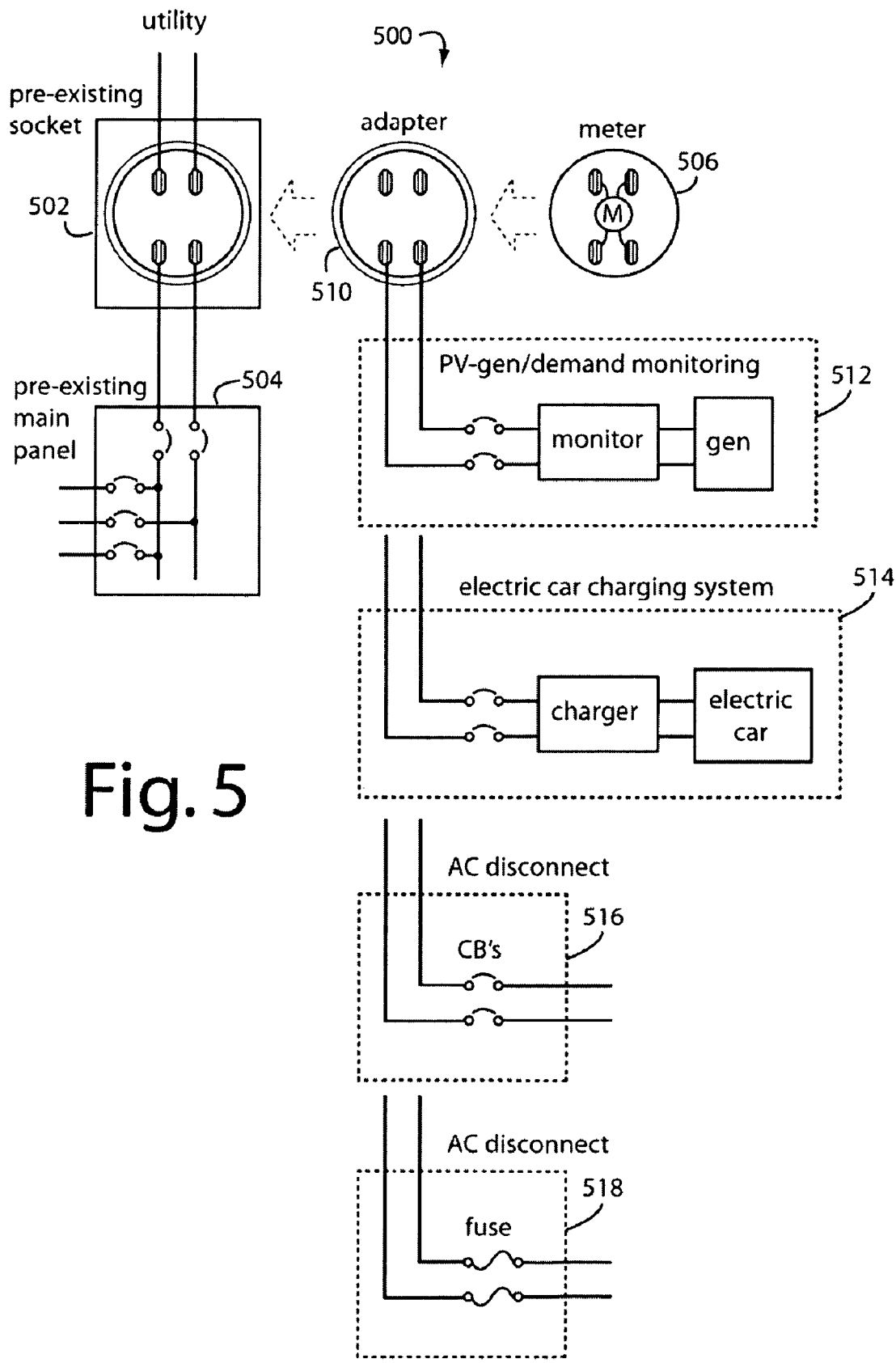

FIG. 4 is a perspective diagram of a service panel, meter, adapter, and solar electric system all mounted and wired together on a wall; and FIG. 5 is a schematic diagram of a pre-existing utility socket, meter, and main panel, and how an adapter embodiment of the present invention would allow the connection of a photovoltaic (PV) generation and demand monitoring system, an electric car charging system, and AC disconnect boxes with standard fittings.

DETAILED DESCRIPTION OF THE PREFERRED EMBODIMENTS

FIG. 1 represents an adapter system embodiment of the present invention, and is referred to herein by the general reference numeral 100. The adapter system 100 makes use of a pre-existing and conventional meter socket 102 and main distribution panel 104 that can be mounted flush inside a wall. A utility power meter 106 measures and registers power usage for a power utility billing purposes. A new solar electric system 108, and especially its electrical equipment panels with an inverter, can be added and surface mounted on a wall near the meter socket 102 and main distribution panel 104 to keep the costs of installation down. The whole point of system 100 is to not disturb pre-existing meter sockets 102 and main distribution panels 104, nor require their upgrading or replacement in order for the solar electric system 108 to be installed and backfeed power into the utility.

It can do this by using adapter 110 to provide a way to connect the AC side of the solar electric system 108 to the load side of the power meter 106. Adapter 110 provides a set of lug terminals for the two AC hot and single neutral connections.

FIG. 2 represents a supply side backfeed meter socket adapter embodiment of the present invention, and is referred to herein by the general reference numeral 200. The adapter 200 is intended to plug into a service panel 202 and to be retained by a standard ring on a lower flange 204. The meter itself is retained by another standard ring on an upper flange 206. An opening 210 in service panel 202 provides an access port in which a utility can be plugged into socket jaws 211-214. Instead of a meter, the adapter 200 plugs in with jaw blades 221-224. These are each electrically and physically extended into socket jaws 231-234 which do accept the meter. Internal wiring brings the two AC hot and one neutral to wiring lugs 241-243. At least one neutral pigtail lead is passed through holes 250 and 252 to be wired to the main neutral bus in the service panel. A solar system can be connected directly to wiring lugs 241-243 to backfeed power to the utility through the meter. Such backfeed will run the meter backwards and can generate revenue for the solar system owner.

Figure 3A:
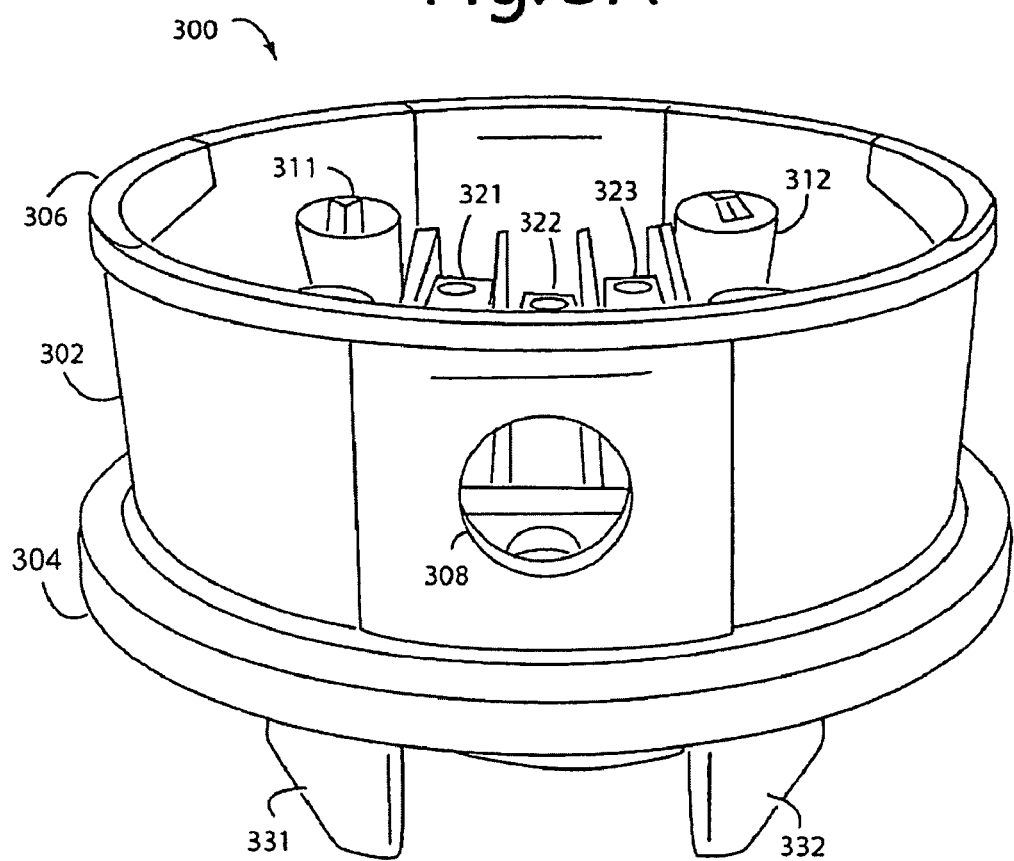
FIG. 3A is a perspective diagram of an adapter embodiment of the present invention constructed of heavy duty plastic or properly insulated and grounded metal and sized to fit between both a meter socket and its corresponding round glass utility meter.
Figure 3B:
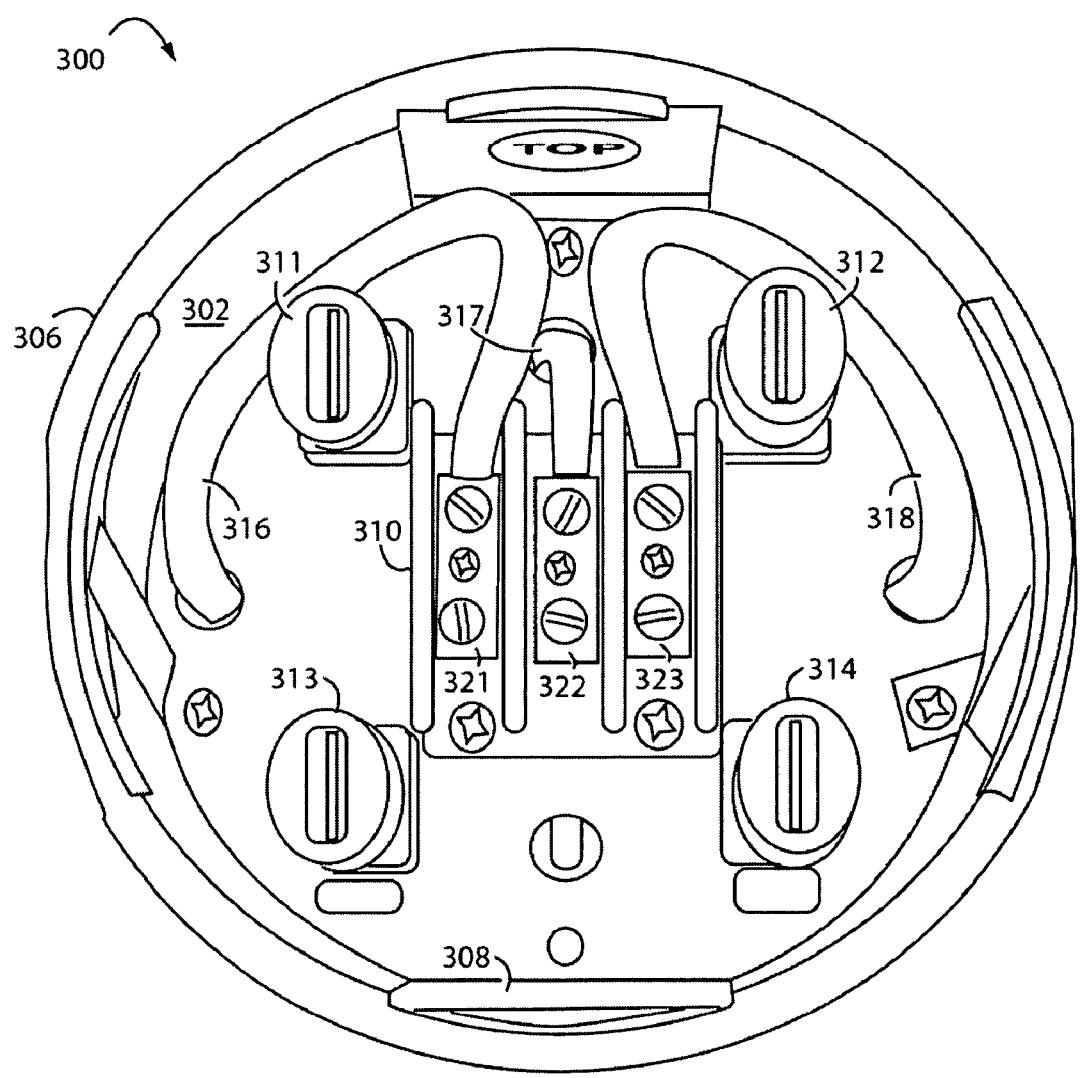
FIG. 3B is a top view diagram of the adapter of FIG. 3A and shows the four jaw sockets used to receive the utility power meter.
Figure 3C:
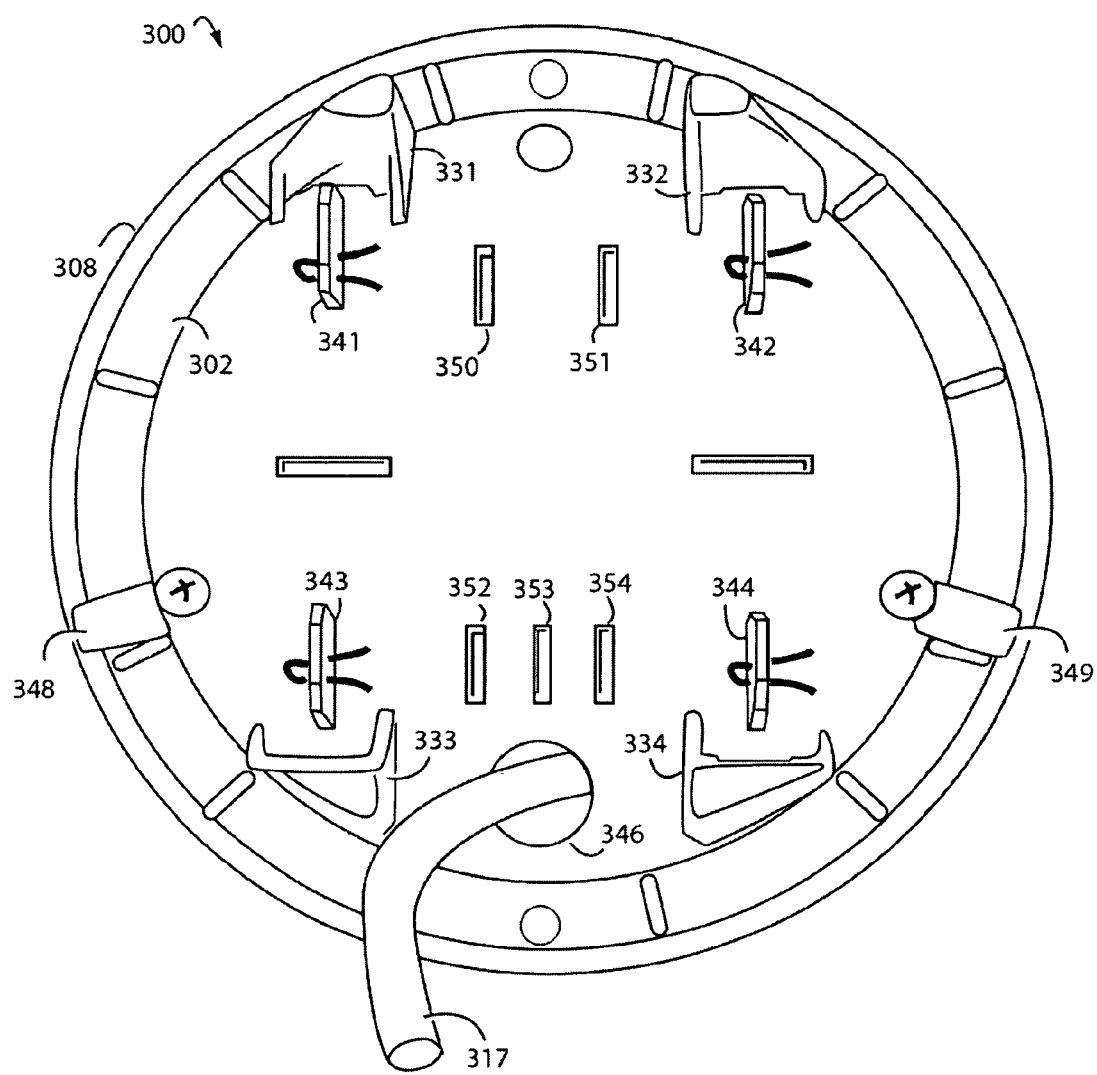
FIG. 3C is a bottom view diagram of the adapter of FIGS. 3A-3B and shows the four jaw blades that plug into the utility power meter socket in the service panels of FIGS. 1-2.

FIGS. 3A-3C represent an adapter embodiment of the present invention, and is referred to herein by the general reference numeral 300. Adapter 300 is typically constructed of heavy duty ABS plastic and sized to fit between a meter socket and its corresponding round glass utility meter. A cylindrical body 302 has a lower flange 304 for a retaining ring to the service panel, and an upper flange 306 for a ring to retain the meter. Grounding straps are typically included around the flanges 304 and 306 to ground the retaining rings. A conduit fitting hole 308 allows for wiring to a solar electric system.

On the topside, as in FIG. 3B, a terminal strip 310 provides wiring lugs to connect to a solar electric system backfeed. A set of four socket jaws 311-314 are provided to make the electrical connections to the utility meter inputs and outputs. Wires 316-318 connect the terminal strip 310 to the service panel below through jaw blades. Wiring lugs 321-323 are provided for an electrician to terminate backfeed connections brought in by conduit from a solar electric system.

On the underside of adapter 300, as in FIG. 3C, bosses 331-334 guide and jaw blades 341-344 plug into the socket jaws provided for a utility meter in a service panel. Ground straps 348-349 prevent meter retaining rings from electrically floating and prevent a hazard. Spare slots 350-354 are typical of places more jaw blades and socket jaws could be installed, e.g., in three phase arrangements.

FIG. 4 shows a principal advantage of using the adapters and methods of the present invention in the later installation of a solar electric system in a home with pre-existing electrical service. An installation 400 uses a supply side backfeed meter socket adapter 402 inserted between a power meter 404 and a pre-existing wall-mounted service panel 406. A wire-pull conduit elbow 408 mounts to the side of adapter 402 and a flexible conduit 410 allows backfeed wiring to a solar electric system mains panel 412. The installation of the solar electric system is simplified by not requiring any changes to the pre-existing wall-mounted service panel 406. A retainer ring 414 secures the meter 404 to the adapter 402, and another retainer ring 416 secures the adapter 402 to the service panel 406. The usual practice is to install lead or plastic tamper seals by the utility to expose any attempts at tampering or theft of electrical services.

FIG. 5 represents an adapter system embodiment of the present invention, and is referred to herein by the general reference numeral 500. The adapter system 500 makes use of a pre-existing and conventional meter socket 502 and main distribution panel 504 that can be mounted to a wall. A utility power meter 506 measures and registers power usage for a power utility billing purposes. A principal objective of system 500 is to not disturb pre-existing meter sockets 502 and main distribution panels 504, nor require their upgrading or replacement in order for other equipment to be installed and powered by the utility.

For example, adapter 510 could be the key installation component needed for a photovoltaic (PV) generation and demand monitoring system 512, an electric car charging system 514, and even simple AC disconnect boxes 516 and 518 with standard fittings for an off-the-shelf AC disconnect into the meter socket adapter.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A supply side backfeed meter socket adapter, comprising:
   a round cylindrical body sized to fit a standard utility power meter, and having top and bottom flanges for retainers to secure the adapter to said utility power meter and a service panel;
   a set of socket jaws in a topside of the body for connection to said utility power meter, and a corresponding set of jaw blades in a bottom of the body for connection to said service panel;
   a wire termination connected to a load side of the socket jaws and jaw blades;
   an access through the side of the body for the connection of electrical equipment not serviced by said service panel;
   a solar electric mains panel mounted on a wall surface next to said service panel; and
   a backfeed connected from said solar electric mains panel through a surface mounted conduit to the side of the round cylindrical body.

2. The adapter of claim 1, further comprising:
   a terminal block disposed inside the body and providing for wiring lugs to connect to the wire termination.

3. The adapter of claim 2, further comprising:
   a neutral pigtail connected to the terminal block and providing for a neutral connection through the access to said electrical equipment not serviced by said service panel.

4. The adapter of claim 1, further comprising:
   at least one conduit fitting hole included in the access.

5. The adapter of claim 1, further comprising:
   mounting at least one wire-pull conduit fitting to the side of the body.

6. The adapter of claim 1, further comprising:
   alignment bosses disposed on said bottom side for guiding and positioning the adapter in the service panel.

7. The adapter of claim 1, further comprising:
   a neutral pigtail connected to the terminal block and providing a neutral connection through said bottom side and into said service panel.

8. The adapter of claim 1, further comprising:
   a power connection through the access for at least one of a fuse-type or a circuit-breaker type AC disconnect with industry standardized electrical fittings.

9. A method for installing a utility backfeed in a pre-existing electrical service panel, comprising:
   inserting an adapter between an electrical utility power meter and a service distribution panel;
   providing the wiring of additional electrical equipment in through the sides of said adapter to the electrical load-side of said electrical utility power meter, wherein said additional electrical equipment can be added without disturbances or extra loads to said service distribution panel;

mounting a solar electric mains panel on a wall surface next to said service distribution panel; and connecting a backfeed from said solar electric mains panel through a surface mounted conduit to the side of said adapter.

10. The method of claim 9, further comprising:

installing a neutral wiring lug inside said adapter for use by said additional electrical equipment; and pig-tailing a wire from said neutral wiring lug down through said adapter for a neutral connection inside said service distribution panel.

11. A meter-socket adapter system, comprising:

a body sized to fit a standard utility power meter, and having a set of socket jaws in a topside of the body for connection to said utility power meter, and a corresponding set of jaw blades in a bottom side of the body for load connection to a service panel;

a wire termination connected to a load side of the socket jaws and jaw blades;

an access through the side of the body for the connection of electrical equipment not serviced by said service panel;

a power connection through the access for a remote for an electrical vehicle charging station;

a solar electric mains panel mounted on a wall surface next to said service panel; and a backfeed connected from said solar electric mains panel through a surface mounted conduit to the side of the body.

12. The system of claim 11, further comprising:

a power connection through the access for a remote demand monitoring, and PV generation monitoring system.

\* \* \* \* \*